(12) United States Patent
Richter et al.

(10) Patent No.: US 10,960,574 B2
(45) Date of Patent: Mar. 30, 2021

(54) COMBINED WAFER PRODUCTION METHOD WITH A RECEIVING LAYER HAVING HOLES

(71) Applicant: Siltectra GmbH, Dresden (DE)

(72) Inventors: Jan Richter, Dresden (DE); Christian Beyer, Freiberg (DE); Anas Ajaj, Dresden (DE)

(73) Assignee: Siltectra GmbH, Dresden (DE)

( * ) Notice: Subject to any disclaimer, the term of this patent is extended or adjusted under 35 U.S.C. 154(b) by 677 days.

(21) Appl. No.: 15/515,520

(22) PCT Filed: Sep. 24, 2015

(86) PCT No.: PCT/EP2015/071948
§ 371 (c)(1),
(2) Date: Mar. 29, 2017

(87) PCT Pub. No.: WO2016/050596
PCT Pub. Date: Apr. 17, 2016

(65) Prior Publication Data
US 2017/0217048 A1    Aug. 3, 2017

(30) Foreign Application Priority Data
Sep. 29, 2014   (DE) ............... 10 2014 014 422.4

(51) Int. Cl.
*B28D 5/00* (2006.01)
*H01L 21/20* (2006.01)
(Continued)

(52) U.S. Cl.
CPC ........ *B28D 5/0011* (2013.01); *H01L 21/2007* (2013.01); *H01L 21/304* (2013.01); *H01L 31/18* (2013.01); *Y10T 225/304* (2015.04)

(58) Field of Classification Search
CPC ........... Y10T 225/304; Y10T 156/1153; Y10T 156/1911; Y10T 156/1158; C03B 33/09;
(Continued)

(56) References Cited

U.S. PATENT DOCUMENTS 6,214,733 B1    4/2001   Sickmiller
8,877,077 B2 *  11/2014  Lichtensteiger ....... B28D 1/221
                                                        117/915
(Continued)

FOREIGN PATENT DOCUMENTS

DE   10 2014 013 107    9/2015
WO      2010072675     12/2009
WO      2013113730      1/2013

OTHER PUBLICATIONS

International search report of corresponding PCT application—PCT/EP2015/071948.
(Continued)

*Primary Examiner* — Laura M Lee
(74) *Attorney, Agent, or Firm* — Murphy, Bilak & Homiller, PLLC

(57) ABSTRACT

A method for producing solid layers includes: providing a solid for separating at least one solid layer; fixing an accommodating layer for holding the solid layer on the solid, wherein the accommodating layer has a multiplicity of holes for conducting a liquid, wherein the accommodating layer is fixed on the solid by means of a connecting layer; and thermal loading of the accommodating layer for mechanical generation of stresses in the solid. A crack in the solid propagates along a detachment plane due to the stresses. The solid layer is separated from the solid by means of the crack. The accommodating layer includes at least one polymer material, and the polymer material undergoes a glass transition at a temperature lower than 0° C.

17 Claims, 3 Drawing Sheets

(51) Int. Cl.
  *H01L 21/304* (2006.01)
  *H01L 31/18* (2006.01)
(58) Field of Classification Search
  CPC ............. C03B 33/091; B32B 43/006; B23K
          26/53–57; B28D 5/0011; B28D 1/221;
          H01L 21/76254; H01L 31/18
  USPC ....... 438/458; 156/701–719, 272.2; 225/93.5
  See application file for complete search history.

(56) References Cited

U.S. PATENT DOCUMENTS

| | | |
|---|---|---|
| 2005/0178495 A1 | 8/2005 | Aspar |
| 2008/0012140 A1 | 1/2008 | Tsukano |
| 2008/0020547 A1 | 1/2008 | Kostrzewa |
| 2009/0047771 A1* | 2/2009 | Yamazaki ........... H01L 27/1214 438/458 |
| 2011/0259936 A1* | 10/2011 | Lichtensteiger ....... B28D 1/221 225/1 |
| 2012/0171866 A1 | 7/2012 | Yonehara |
| 2013/0089969 A1* | 4/2013 | Wagner ................. C30B 29/40 438/463 |

OTHER PUBLICATIONS

International preliminary report on patentability of corresponding PCT application—PCT/EP2015/071948.

* cited by examiner

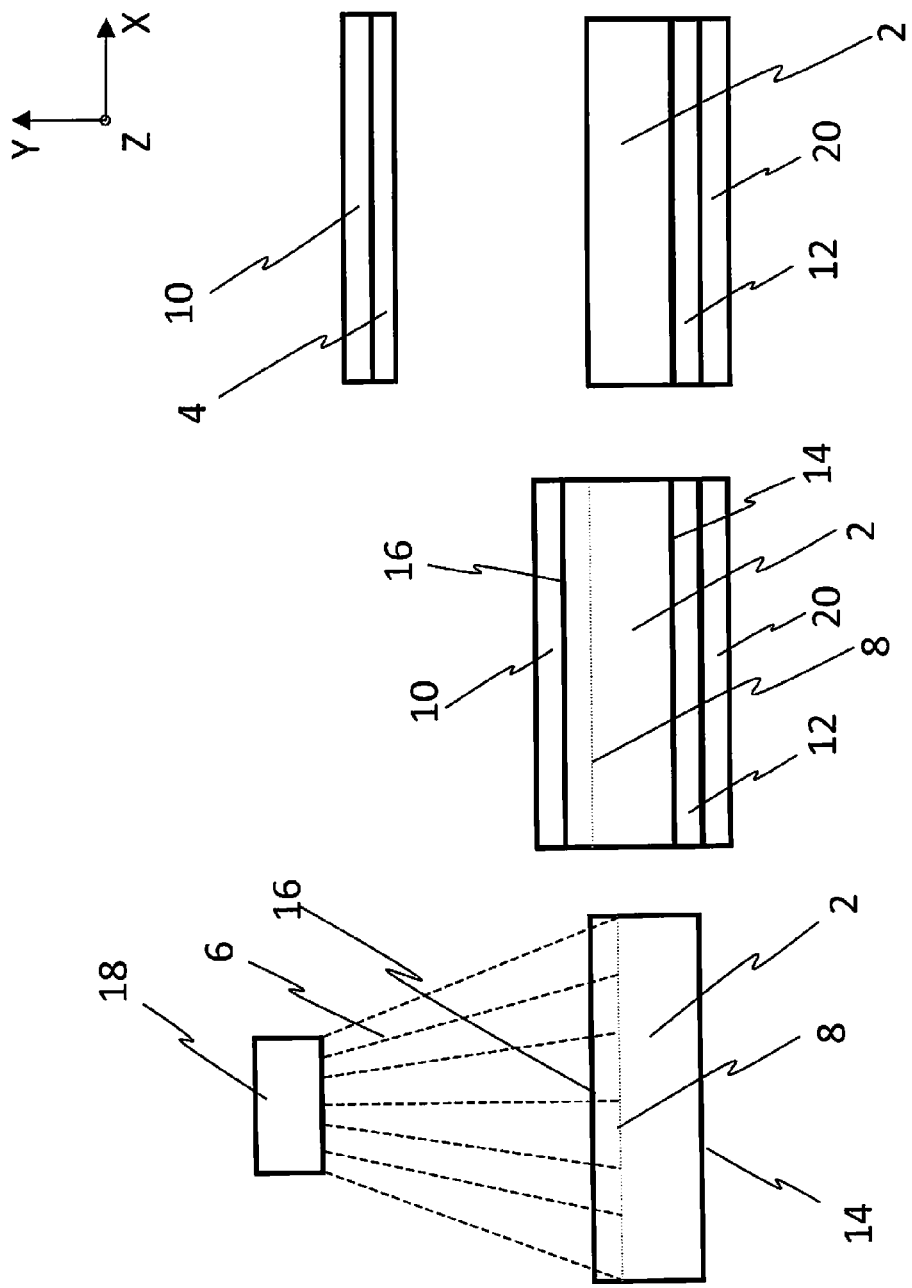

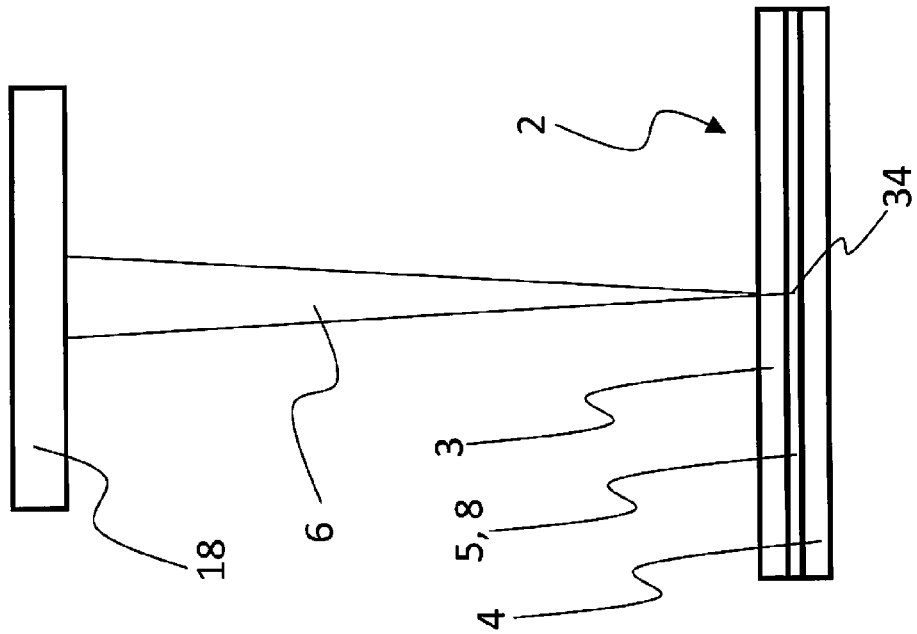
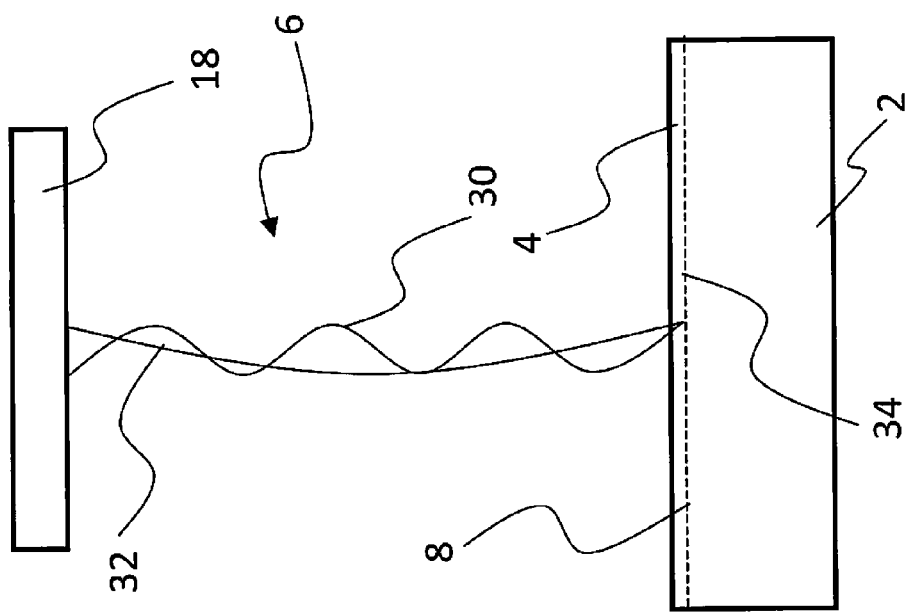

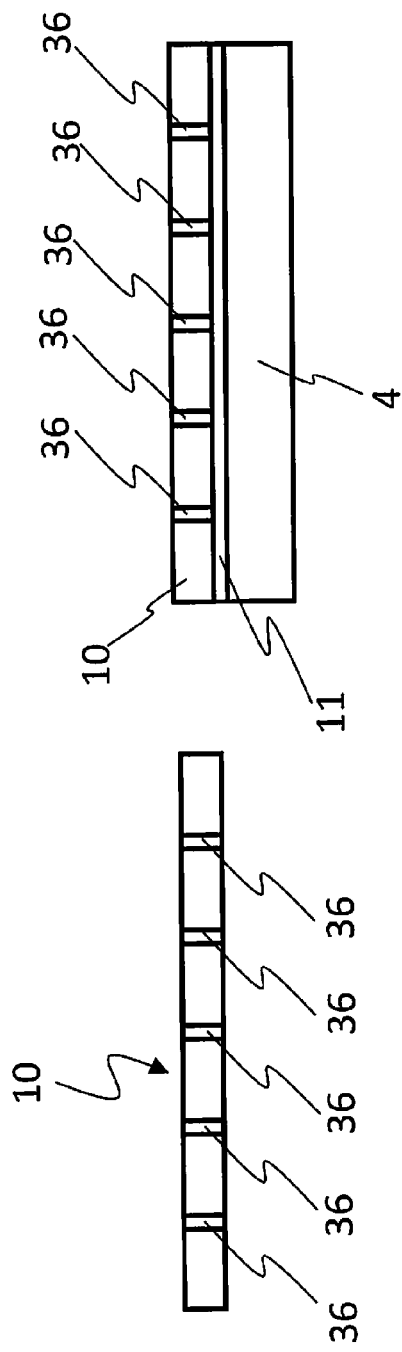
Fig. 3a
Fig. 3b
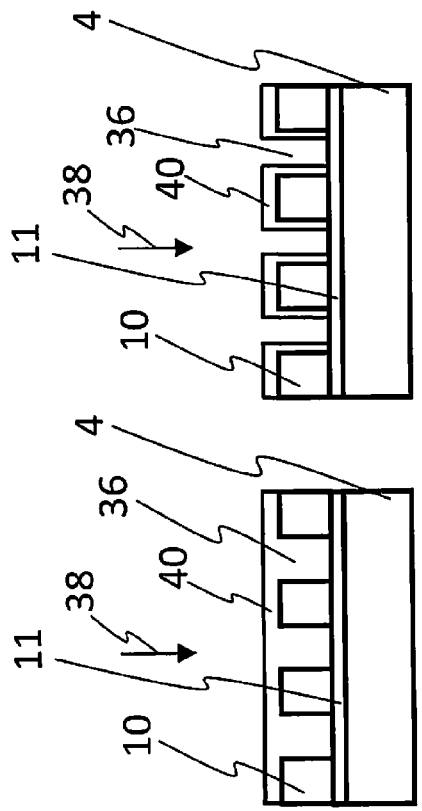
Fig. 3c
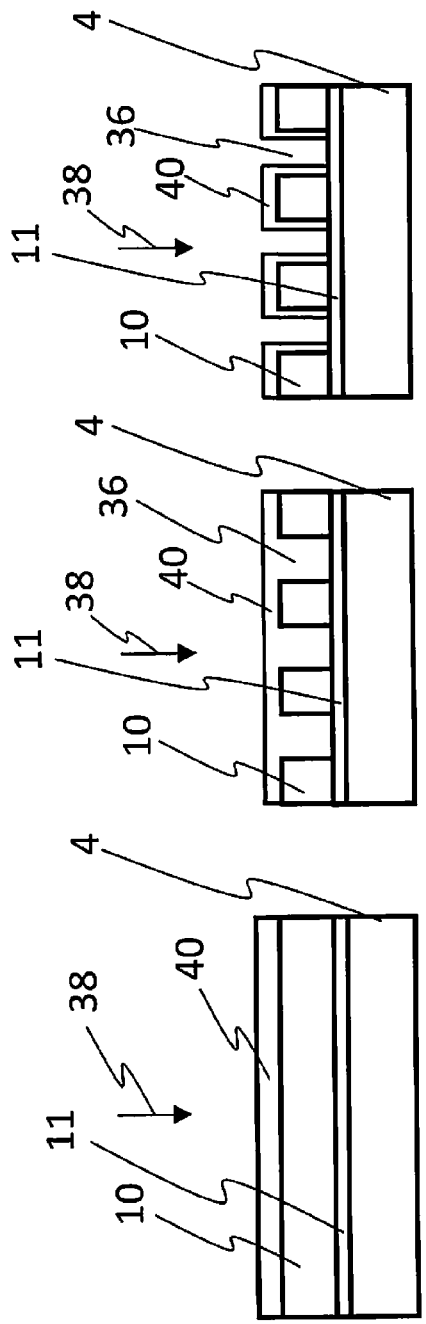
Fig. 3d
Fig. 3e

COMBINED WAFER PRODUCTION METHOD WITH A RECEIVING LAYER HAVING HOLES

The present invention relates to a method for producing solid layers according to the subject of Claim 1, to a wafer producing by means of this method according to Claim 13, to a film according to Claim 14 and, according to Claim 15, to a use of this film.

In many technical fields (e.g. microelectronic or photovoltaic technology), materials, such as e.g. silicon, germanium or sapphire are often used in the form of thin wafers and plates (wafers). As standard, such wafers are currently produced from an ingot by means of saws, wherein relatively large material losses ("kerf loss") arise. As the initial material used is often very expensive, strong efforts are made to produce such wafers with less material outlay and therefore more efficiently and less expensively.

For example, in currently customary methods alone in the case of the production of silicon wafers for solar cells, almost 50% of the material used is lost as "kerf loss". Seen globally, this corresponds to an annual loss of more than 2 billion Euros. As the costs of the wafer make up the largest share of the costs of the finished solar cell (more than 40%), appropriate improvements in the wafer production could significantly reduce the costs of solar cells.

Methods, which dispense with the conventional saws and e.g. can split off thin wafers from a thicker workpiece directly by using temperature-induced stresses, appear particularly attractive for such a wafer production without kerf loss ("kerf-free wafering"). These particularly include methods as are described e.g. in PCT/US2008/012140 and PCT/EP2009/067539, where a polymer layer applied onto the workpiece is used for generating these stresses.

In the methods mentioned, the polymer layer has a coefficient of thermal expansion which is higher by approximately two orders of magnitude compared to the workpiece. In addition, by making use of a glass transition, a relatively high modulus of elasticity can be achieved in the polymer layer, so that sufficiently large stresses can be induced in the layer system, polymer layer/workpiece, by cooling, in order to enable the splitting off of wafers from the workpiece.

When a wafer is split off from the workpiece in the methods mentioned, polymer still adheres on one side of the wafer. The wafer is very strongly curved in the direction of this polymer layer in this case, which makes controlled splitting off more difficult, and e.g. can lead to thickness variations of the wafer that is split off. In addition, the strong curvature makes further processing more difficult and can even lead to breakage of the wafer.

When using the methods according to the previous prior art, the wafers produced usually have relatively larger thickness variations in each case, wherein the spatial thickness distribution often shows a pattern with fourfold symmetry. The total thickness fluctuation over the entire wafer ("total thickness variation", TTV) is often more than 100% of the average wafer thickness when using previous methods (a wafer of, for example, 100 micrometres average thickness, which is e.g. 50 micrometres thick at its thinnest point and 170 micrometres thick at its thickest point, has a TTV of 170−50=120 micrometres, which corresponds to a total thickness variation of 120% relatively to its average thickness). Wafers with such stark thickness variations are not suitable for many applications. In addition, in the thickness-distribution patterns which occur most often, the regions with the largest variations are unfortunately in the centre of the wafer, where they cause the most disruption.

In addition, in the method according to the current prior art, during break propagation during splitting off itself, undesired oscillations arise in the layer systems involved, which unfavourably influence the course of the fracture front and in particular can lead to significant thickness variations of the wafer which is split off.

Furthermore, detaching the polymer layer from the wafer which is split off takes a very long time, as a liquid must penetrate into the intermediate space between films and wafer during detachment, as a result of which the polymer layer cannot be used for separating a further wafer for a very long time.

Therefore, it is the object of the present invention to provide a method for producing solid layers, which enables the inexpensive and fast production of solid plates or wafers with an even thickness, particularly with a TTV of less than 120 micrometres.

The previously mentioned object is achieved by means of a method according to Claim 1 for producing solid layers. In this case, the method preferably comprises at least the steps, providing a solid for separating at least one solid layer, fixing an accommodating layer for holding the solid layer on the solid, wherein the accommodating layer has a multiplicity of holes for conducting a liquid, wherein the accommodating layer is fixed on the solid by means of a connecting layer, and thermal loading of the accommodating layer for the, in particular mechanical, generation of stresses in the solid, wherein a crack in the solid propagates along a detachment plane due to the stresses, wherein the solid layer is separated from the solid by means of the crack.

This solution is advantageous, as the fluid for weakening or decomposing or dissolving the connecting layer can be guided onto the connecting layer much easier or faster or in greater quantities through the holes in the accommodating layer. In other words, according to a further preferred embodiment of the present invention for detaching the accommodating layer from the solid, a fluid, particularly a liquid, can therefore be supplied to the connecting layer through the holes, wherein the fluid causes the fixing of the accommodating layer on the solid to be weakened or terminated.

Further advantageous embodiments are the subject of the following description and/or the dependent claims.

According to a further preferred embodiment of the present invention, the holes have a diameter of less than 1 mm, preferably of less than 0.5 mm and particularly preferably of less than 0.1 mm. This embodiment is advantageous, as the smaller the holes in the accommodating layer or in the film are, the more homogeneously or planarly a crack guidance takes place in the interior of the solid.

According to a further preferred embodiment of the present invention, the accommodating layer has more than 10 holes, preferably more than 100 holes and particularly preferably more than 1000 holes. This embodiment is advantageous, as the accommodating layer or film e.g. can have a greater number of holes in certain regions than in other regions, as a result of which more liquid can be guided through the accommodating layer in the same time in the region with the greater number of holes. Preferably, the accommodating layer has area segments, which have more than 1, 2, 3, 4 or 5 holes, particularly more than 10 holes, particularly more than 50 holes, in particular more than 100 holes per cm$^2$. Furthermore, it is conceivable that the holes in certain sections of the accommodating layer or over the entire accommodating layer are distributed homogeneously.

According to a further preferred embodiment of the present invention, at least one further hole is formed in a radius of less than 50 mm, preferably less than 25 mm and particularly preferably less than 5 mm, 4 mm, 3 mm, 2 mm, 1 mm or 0.5 mm around the centre of each hole. This embodiment is advantageous, as an exceptionally defined and fast fluid conduction through the accommodating layer is possible by means of this arrangement.

According to a further preferred embodiment of the present invention, defects are created in the inner structure of the solid to predefine the detachment plane by means of at least one radiation source, particularly a laser, particularly a femtosecond laser (fs laser), before or after the application of the accommodating layer on the solid.

This solution is advantageous, as the detachment layer or defect layer in the solid can be created by means of the radiation source, by means of which detachment layer or defect layer the crack is routed or guided, which enables the realization of very small TTVs, particularly smaller than 200 micrometres or 100 micrometres or smaller than 80 micrometres or smaller than 60 micrometres or smaller than 40 micrometres or smaller than 20 micrometres or smaller than 10 micrometres or smaller than 5 micrometres, particularly 4, 3, 2 or 1 micrometre(s). The radiation loading of the wafer therefore creates a type of perforation in the interior of the solid in a first step, along which, in a second step, the crack propagation takes place or along which the solid layer is separated from the solid.

This embodiment is furthermore advantageous, as due to the defect-caused crack guidance, the holes in the accommodating layer are prevented from having an influence on the topography of the surface structure created by means of the crack or the influence of the holes on the topography is very considerably reduced. Due to the defects or the prior laser damage, it is namely achieved that the crack runs in a sufficiently stable manner in the crack plane or crack contour defined by the defects.

According to a preferred embodiment of the present invention, the laser has a pulse duration of less than 10 ps, particularly preferably less than 1 ps and at best less than 500 fs.

According to a preferred embodiment of the present invention, the stresses for detaching the solid layer from the solid are generated by means of the thermal loading of the accommodating layer, particularly a polymer layer. The thermal loading particularly constitutes a cooling of the accommodating layer or polymer layer to or to below the ambient temperature and preferably below 10° C. and particularly preferably below 0° C. and further preferably below −10° C. The cooling of the polymer layer most preferably takes place in such a manner that at least a part of the polymer layer, which preferably consists of PDMS, undergoes a glass transition. The cooling can here be a cooling to less than −100° C., which can be effected e.g. by means of liquid nitrogen. This embodiment is advantageous, as the polymer layer contracts and/or experiences a gas transition as a function of the temperature change and transmits the thus-created forces to the solid, as a result of which mechanical stresses can be generated in the solid, which cause a crack and/or lead to crack propagation, wherein the crack initially propagates along the first detachment plane for splitting off the solid layer.

According to a preferred embodiment of the present invention, the solid is arranged on a holding layer for holding the solid, wherein the holding layer is arranged on a first planar area segment of the solid, wherein the first planar area segment of the solid is spaced from a second planar area segment of the solid, wherein the polymer layer is arranged on the second planar area segment and wherein the detachment plane is orientated parallel or is created parallel with respect to the first planar area segment and/or the second planar area segment.

This embodiment is advantageous, as the solid is arranged at least in certain sections and preferably completely between the holding layer and the polymer layer, as a result of which the stresses for crack creation or crack propagation can be introduced into the solid by means of one of these layers or by means of both layers.

According to a further preferred embodiment of the present invention, at least or exactly one radiation source for providing the radiation to be introduced into the solid is configured in such a manner that the beams radiated by the radiation source create the defects at predetermined locations inside the solid. This embodiment is advantageous, as exceptionally precise defects can be created in the solid by means of a radiation source, particularly by means of a laser.

Two use cases result in particular for the method, termed "wafering" and "thinning" in the following. In "wafering", the method is usually used to detach a thick layer from an even thicker semiconductor block, typically a wafer (with the industry-specific thicknesses) from an ingot. In "thinning", the method is used to split a very thin layer off from a wafer, which corresponds to the current process of grinding, but with the advantage that the material which is not required remains intact and can be reused. A clear separation of "thinning" and "wafering" is complicated, because e.g. "thinning" can also take place by loading from the rear side of a wafer, so that although a thin layer is created, the laser penetrates deeply into the material.

For the case of "thinning":

According to a further preferred embodiment of the present invention, the radiation source is set up in such a manner that the beams radiated by the radiation source for creating the detachment plane penetrate into the solid to a defined depth, particularly <100 μm. Preferably, the detachment plane is formed in a spaced parallel manner to an outer and preferably planar surface of the solid. The detachment plane is preferably constructed to be spaced, inside the solid, less than 100 micrometres and preferably less than 50 micrometres and particularly preferably less than or equal to 20, 10, 5 or 2 micrometres from the planar surface of the solid. Thus, the detachment plane is preferably constructed in the form of a plane created from defects, wherein the defects are constructed to be spaced, inside the solid, less than 100 micrometres and preferably less than 50 micrometres and particularly preferably less than 20, 10 or 2 micrometres from the planar surface of the solid.

For the case of "wafering":

According to a further preferred embodiment of the present invention, the radiation source is set up in such a manner that the beams radiated by the radiation source for creating the detachment plane penetrate into the solid to a defined depth, particularly >100 μm. Preferably, the detachment plane is formed in a spaced parallel manner to an outer and preferably planar surface of the solid. The detachment plane is preferably constructed to be spaced, inside the solid, more than 100 micrometres and preferably more than 200 micrometres and particularly preferably more than 400 or 700 micrometres from the planar surface of the solid. Thus, the detachment plane is preferably constructed in the form of a plane created from defects, wherein the defects are constructed to be spaced, inside the solid, more than 100 micrometres and preferably more than 200 micrometres and particularly preferably more than 400 or 700 micrometres from the planar surface of the solid.

According to a further preferred embodiment of the present invention, the solid is loaded with a predetermined wavelength and/or power, wherein the predetermined wavelength is preferably adapted to the respective material or substrate. This embodiment is advantageous, as the defect size can be influenced by the wavelength and/or the power.

According to a further preferred embodiment of the present invention, the solid has silicon and/or gallium or perovskite and the polymer layer and/or the holding layer consist at least to some extent and preferably completely or more than 75% of polydimethylsiloxane (PDMS), wherein the holding layer is arranged on a surface, which is planar at least in certain sections, of a stabilizing device, which consists at least to some extent of at least one metal. The stabilizing device is preferably a plate, particularly a plate which comprises aluminium or consists of aluminium. This embodiment is advantageous, as the solid is defined or held securely by means of the stabilizing device and the holding layer, as a result of which the stresses can be generated in the solid very precisely.

According to a further preferred embodiment of the present invention, the stresses in the solid can be set or generated in such a manner that the crack formation and/or the crack propagation for creating a topography of the surface resulting in the crack plane can be controlled. The stresses can therefore preferably be generated with different intensities in different regions of the solid, preferably at least temporarily. This embodiment is advantageous, as the topography of the created or separated solid layer can advantageously be influenced by controlling the crack formation and/or the crack path.

According to a further preferred embodiment of the present invention, the defects predefine at least one crack guidance layer, wherein the at least one crack guidance layer has a shape deviating from a planar shape. This solution is advantageous, as the solid layers created or the solids created can have a shape deviating from a planar layer. Thus, it is no longer only planar layers, but rather likewise three-dimensional bodies which can be formed or created from a workpiece by means of crack propagation. Solids produced in such a manner have a very advantageous surface which is only to be reworked a little or not at all owing to the production method. Thus, e.g. optical elements, such as e.g. a spar or a lens can be produced in a single-stage or multiple-stage, particularly two- or three-stage, splitting process.

According to a preferred embodiment of the present invention, the shape of the crack guidance layer therefore has the contour of a three-dimensional object, particularly a lens or a spar, at least in certain sections.

According to a preferred embodiment of the present invention, the defects are created by means of a defect-creating device or the radiation source, wherein the defect-creating device is configured in such a manner that the defects are created with a constant spacing from the defect-creating device in the workpiece, wherein the workpiece and the defect-creating device are inclined relatively to one another such that the defects created by the defect-creating device are created in the crack guidance layer, wherein the defect-creating device and the workpiece are only repositioned two-dimensionally with respect to one another during defect creation. The defect-creating device is therefore preferably repositioned with respect to the workpiece or the workpiece is repositioned with respect to the defect-creating device or the defect-creating device and the workpiece are both repositioned with respect to one another.

This embodiment is advantageous, as the radiation source or the defect-creating device for defect creation only have to be repositioned and no modification of the defect-creating device has to be effected, in particular a changed defect-introduction depth does not have to be determined and set up.

According to a further preferred embodiment, the defects are created by means of a defect-creating device or the radiation source, wherein the defect-creating device is configured in such a manner that the defects are created in the workpiece with a temporally changing spacing from the defect-creating device, wherein a modification of the defect-creating device is effected at least temporarily as a function of the spacing of the defect-creating device from the defect to be created, in particular a changed defect-introduction depth is determined and set up. This embodiment is advantageous, as an inclining device for inclining the workpiece preferably does not have to be provided.

The solid preferably has a material or a material combination from one of the main groups 3, 4 and 5 of the periodic table of the elements, such as e.g. Si, SiC, SiGe, Ge, GaAs, InP, GaN, Al2O3 (sapphire), AlN. Particularly preferably, the solid has a combination of elements present in the third and fifth groups of the periodic table. Conceivable materials or material combinations in this case are e.g. gallium arsenide, silicon, silicon carbide, etc. Furthermore, the solid may comprise a ceramic (e.g. Al2O3—aluminium oxide) or consist of a ceramic, preferred ceramics in this case are e.g. perovskite ceramics (such as e.g. Pb—, O—, Ti—Zr-containing ceramics) in general and lead-magnesium niobates, barium titanate, lithium titanate, yttrium-aluminium garnet, particularly yttrium-aluminium garnet crystals for solid-state laser applications, SAW (surface acoustic wave) ceramics, such as e.g. lithium niobate, gallium orthophosphate, quartz, calcium titanate, etc., specifically. The solid therefore preferably comprises a semiconductor material or a ceramic material or particularly preferably, the solid consists of at least one semiconductor material or a ceramic material. It is furthermore conceivable that the solid comprises a transparent material or consists of or is manufactured from a transparent material, such as e.g. sapphire. Further materials, which here come into question alone or in combination with a different material, are e.g. "wide band gap" materials, InAlSb, high-temperature superconductors, particularly rare-earth cuprates (e.g. YBa2Cu3O7).

According to a further preferred embodiment of the present invention, the radiation source or a part of the radiation source is constructed as a femtosecond laser (fs laser). This solution is advantageous, as the vertical propagation of the disrupted material is minimized by the use of an fs laser. By using an fs laser, it is possible to introduce or create defects in the workpiece very precisely. The wavelength and/or the energy of the fs laser are preferably to be chosen in a material-dependent manner.

According to a further preferred embodiment of the present invention, the energy of the radiation source, particularly of the laser beam, particularly of the fs laser, is chosen such that the damage propagation in the solid or in the crystal is smaller than three-times the Rayleigh length, preferably smaller than the Rayleigh length and particularly preferably smaller than a third of the Rayleigh length.

According to a further preferred embodiment of the present invention, the wavelength of the laser beam, particularly of the fs laser, is chosen such that the absorption of the solid or the material is lower than 10 cm$^{-1}$ and preferably lower than 1 cm$^{-1}$ and particularly preferably smaller than 0.1 cm$^{-1}$.

According to a further preferred embodiment of the present invention, the individual defects in each case result from a multiple-photon excitation effected by the radiation source, particularly the laser, particularly an fs laser.

Furthermore, according to a further preferred embodiment of the present invention, it is conceivable that the accommodating layer comprises a further material, which is preferably applied as a coating onto the polymer. Alternatively, it is however also conceivable that the polymer is applied as a coating onto the further material.

According to a further preferred embodiment of the present invention, the coating has local weaknesses, in particular, the coating is broken, particularly in order to follow a deformation effected by the polymer during stress generation.

According to a further preferred embodiment of the present invention, the thermal conductivity (W/m*K) of the further material is more than 5-times larger, preferably more than 10-times larger and particularly preferably more than 30-, more than 100-, more than 200- or more than 300-times larger than that of the polymer, wherein the further material is preferably a metal or an alloy.

According to a further preferred embodiment of the present invention, the further material is provided in the form of elongated elements, particularly splinters, inside a layer structure predetermined by the polymer, wherein the splinters are preferably orientated in such a manner that the longitudinal axes thereof (preferably at least mostly) extend in an inclined manner, particularly orthogonally, with respect to the layer direction of extent. Preferably, to this end, the splinters are introduced into the liquid polymer during the creation of the accommodating layer and e.g. orientated by means of magnet loading.

The invention furthermore relates to a wafer, which is produced according to a method according to one of Claims 1 to 12.

The invention furthermore relates to a film for stress generation in a solid, wherein the film comprises at least one polymer material, particularly PDMS, wherein the polymer material undergoes a glass transition at a temperature lower than 0° C., particularly at a temperature lower than −50° C. Particularly preferably, the film has a multiplicity of holes for conducting a liquid, wherein the holes in each case have a diameter of less than 5 mm.

Furthermore, the present invention relates to a use of a film according to Claim 14 as an accommodating layer in a method according to Claim 1.

Furthermore, the subjects of the published documents WO 2013/113730 A1, PCT/US2008/012140, PCT/EP2009/067539, DE 102013016666.7 and DE102014013107.6 are made the subject of the present patent application in full by reference. Likewise, the subjects of all further patent applications submitted by the applicant on the application date of the present patent application and relating to the field of the production of solid layers are made the subject of the present patent application by reference.

Further advantages, aims and properties of the present invention are explained on the basis of the following description of the attached drawings, in which the wafer production according to the invention is illustrated by way of example. Components or elements of the wafer production according to the invention, which at least substantially match in the figures in terms of their function, may here be labelled with the same reference numbers, wherein these components or elements do not have to be numbered or explained in all figures.

In the figures:

FIG. 1a shows a schematic design for generating local stresses in a solid;

FIG. 1b shows a schematic illustration of a layer arrangement before the separation of a solid layer from a solid;

FIG. 1c shows a schematic illustration of a layer arrangement after the separation of a solid layer from a solid;

FIG. 2a shows a first schematically illustrated variant for generating local stresses by means of radiation, particularly light waves;

FIG. 2b shows a second schematically illustrated variant for generating local stresses by means of radiation, particularly by means of light waves;

FIG. 3a shows an accommodating layer according to the invention;

FIG. 3b shows an accommodating layer according to the invention, which is arranged on a solid;

FIG. 3c shows a second accommodating layer according to the invention, which is arranged on a solid;

FIG. 3d shows a third accommodating layer according to the invention, which is arranged on a solid; and FIG. 3e shows a fourth accommodating layer according to the invention, which is arranged on a solid.

A workpiece 2 or a substrate is shown in FIG. 1a, which is arranged in the region of a radiation source 18, particularly a laser, particularly a femtosecond laser (fs laser). The workpiece 2 preferably has a first, particularly planar, area segment 14 and a second, particularly planar, area segment 16, wherein the first planar area segment 14 is preferably orientated substantially or exactly parallel to the second planar area segment 16. The first planar area segment 14 and the second planar area segment 16 preferably delimit the workpiece 2 in a Y direction, which is preferably orientated vertically. The planar area segments 14 and 16 preferably extend in each case in an X-Z plane, wherein the X-Z plane is preferably orientated horizontally. Furthermore, it can be drawn from this illustration that the radiation source 18 radiates beams 6 simultaneously or in a time-offset manner onto the workpiece 2. Depending on the configuration, the beams 6 penetrate to a defined depth into the workpiece 2 and generate local stresses at the respective position or at a predetermined position.

In FIG. 1b, a multiple-layer arrangement is shown, wherein the workpiece 2 contains the crack guidance layer 8 and is provided with a holding layer 12 in the region of the first planar area segment 14, which in turn is preferably overlaid by a further layer 20, wherein the further layer 20 is preferably a stabilizing device, particularly a metal plate. A polymer layer 10 is preferably arranged on the second planar area segment 16 of the workpiece 2. The accommodating layer or polymer layer 10 and/or the holding layer 12 preferably consist at least to some extent and particularly preferably completely from PDMS and particularly preferably has a multiplicity of holes, particularly blind holes and/or through holes.

A state after crack formation and subsequent crack guidance is shown in FIG. 1c. The solid layer 4 adheres on the polymer layer 10 and is spaced or can be spaced from the remainder of the workpiece 2.

Examples for the creation, shown in FIG. 1a, of a crack guidance layer 8 by introducing local stresses into a workpiece 2, particularly by means of light beams, are shown in FIGS. 2a and 2b.

The present invention therefore relates to a method for producing solid layers. The method according to the invention can in this case additionally or alternatively comprise one, a plurality or all of the steps listed below, particularly providing a workpiece 2 for separating at least one solid layer 4, generating preferably defined local stresses or local stresses by means of at least one radiation source, particularly an fs laser, in the inner structure of the solid for predefining a crack guidance layer, along which the solid layer is separated from the solid, and thermal loading of a polymer layer 10 arranged on the workpiece 2, for, in particular mechanical, generation of detachment stresses in the workpiece 2, wherein a crack in the workpiece 2 propagates along the crack guidance layer 8 due to the detachment stresses, which crack separates the solid layer 4 from the workpiece 2. The local stresses here preferably cause the crack propagation to take place in the desired crack guidance layer 8.

In FIG. 2a, it is therefore shown schematically how local stresses 34 can be generated in a workpiece 2, particularly for creating a crack guidance layer 8 by means of a radiation source 18, particularly one or more lasers, particularly a plurality of fs lasers. The radiation source 18 in this case emits radiation 6 with a first wavelength 30 and a second wavelength 32. The wavelengths 30, 32 are in this case preferably adapted to one another in such a manner or the distance between the radiation source 18 and the crack guidance layer 8 to be created is preferably adapted in such a manner that the waves 30, 32 coincide substantially or exactly on the crack guidance layer 8 in the workpiece 2, as a result of which local stresses or defects are created at the site of the coincidence 34 as a consequence of the energies of the two waves 30, 32. The generation of the local stresses can in this case take place by means of different or combined mechanisms, such as e.g. sublimation, fusing and/or chemical reaction.

A focussed laser beam 6 is shown in FIG. 2b, the focal point of which preferably lies in the crack guidance layer 8. It is conceivable here that the light beam 6 is focussed by one or more focussing bodies, particularly (a) lens(es) (not shown). The workpiece 2 is constructed with multiple layers in this embodiment and preferably has a partially transparent or transparent substrate layer 3 or material layer, which preferably consists of sapphire or comprises sapphire. The light beams 6 reach through the substrate layer 3 to the crack guidance layer 8, which is preferably formed by a sacrificial layer 5, wherein the sacrificial layer 5 is loaded by the radiation in such a manner that the generation of local stresses in the sacrificial layer 5 is effected at the focal point or in the region of the focal point. It is likewise conceivable that the local stresses for creating the crack guidance layer 8 are generated in the region of or precisely on a boundary surface between two layers 3, 4. Thus, it is likewise conceivable that the solid layer 4 is created on a support layer, particularly a substrate layer 3, and a crack guidance layer 8 for detaching or separating the solid layer 4 can be created by means of one or more sacrificial layers 5 and/or by means of the generation of local stresses in a boundary surface, particularly between the solid layer 4 and the support layer.

FIG. 3a shows an accommodating layer 10 or film according to the invention for generating stress in a solid. In this case, the film preferably has at least one polymer material, particularly PDMS, wherein the polymer material undergoes a glass transition at a temperature lower than 20° C., particularly at lower than 10° C., particularly at lower than 0° C., particularly at a temperature lower than −50° C. The film particularly preferably has a multiplicity of holes 36 for conducting a liquid, wherein the holes 36 in each case have a diameter of less than 5 mm.

FIG. 3b shows a solid 2 and a solid layer 4 separated therefrom. An accommodating layer 10 or a film 10 is also arranged on the solid layer 4, by means of which accommodating layer or film the stresses required for creating a crack for separating the solid layer 4 from the solid 2 were generated. The accommodating layer 10 has a multiplicity of holes for conducting a liquid, wherein the accommodating layer 10 is fixed on the solid layer 4 by means of a connecting layer 11.

FIG. 3c shows a further accommodating layer 10 or film according to the invention, which can preferably likewise be arranged or is arranged on the solid 4 by means of a connecting layer 11. The accommodating layer 10 in this case preferably has a first material portion 39, particularly a polymer portion, and a second material portion 40, particularly a metal portion. The second material portion 40 in this case preferably constitutes a coating of the first material portion 39 and particularly preferably is used for accelerated cooling of the first material portion 39. The accommodating layer 10 is in this case preferably loaded from direction 38 with cold, particularly liquid nitrogen, as a result of which the second material portion 40 rapidly cools down and in particular by means of the direct contact with the first material portion 39, likewise cools the same very fast.

FIG. 3d shows a further variant of the accommodating layer 10 or film according to the invention, which is in turn formed by the first material portion 39 and the second material portion 40. The first material portion 39 preferably has holes 36, which are filled by the second material portion 40. Preferably, the second material portion 40 likewise coats the first material portion 39 on the upper side, i.e. parallel to the connecting layer 11.

FIG. 3e shows another further variant of the accommodating layer 10 or film according to the invention, which is in turn formed by the first material portion 39 and the second material portion 40. The first material portion 39 preferably has holes 36, which are lined by the second material portion 40, i.e. the wall delimiting the respective hole 36 is coated with the second material portion. Preferably, the second material portion 40 likewise coats the first material portion 39 on the upper side, i.e. parallel to the connecting layer 11.

Furthermore, it is preferably additionally or alternatively conceivable that the method for producing solid layers comprises one, a plurality or all of the following mentioned steps: Providing a solid 2 for separating at least one solid layer 4, arranging an accommodating layer 10 for holding the solid layer 4 on the solid 2, wherein the accommodating layer consists at least of a polymer and a further material, wherein the accommodating layer preferably mostly consists of the polymer in terms of volume and/or in terms of mass, wherein the further material has a greater conductivity than the polymer, thermal loading of the accommodating layer 10 for the, in particular mechanical, generation of stresses in the solid 2, wherein a crack in the solid 2 propagates along a detachment plane 8 due to the stresses, wherein the solid layer 4 is separated from the solid 2 by means of the crack.

Furthermore, the film according to the invention for generating stress in a solid preferably comprises at least one polymer material, particularly PDMS, and a further material, wherein the film mostly consists of the polymer material in terms of volume, wherein the material has a greater thermal conductivity than the polymer material, wherein the polymer material preferably undergoes a glass transition at a temperature lower than 0° C., particularly at a temperature lower than −50° C.

REFERENCE LIST

2 Workpiece
3 Substrate

4 Solid layer
5 Sacrificial layer
6 Radiation
8 Crack guidance layer
10 Accommodating layer/film
11 Connecting layer
12 Holding layer
14 First planar area segment
16 Second planar area segment
18 Radiation source/defect-creating device
20 Stabilizing device
36 Hole
38 Loading with cold
39 First material portion
40 Second material portion
X First direction
Y Second direction
2 Third direction

The invention claimed is:

1. A method for producing solid layers, comprising:
providing a solid for separating at least one solid layer;
fixing an accommodating layer for holding the solid layer on the solid, wherein the accommodating layer has a multiplicity of holes for conducting a liquid, wherein the accommodating layer is fixed on the solid by means of a connecting layer;
thermal loading of the accommodating layer for mechanical generation of stresses in the solid, wherein a crack in the solid propagates along a detachment plane due to the stresses, wherein the solid layer is separated from the solid by means of the crack, wherein the accommodating layer comprises at least one polymer material, wherein the polymer material undergoes a glass transition at a temperature lower than 0° C.; and
after the thermal loading, guiding a fluid through the holes in the accommodating layer and onto the connecting layer, wherein the fluid weakens, decomposes or dissolves the connecting layer such that the fixing of the accommodating layer on the solid is weakened or terminated,
wherein the accommodating layer comprises a first material portion and a second material portion different than the first material portion,
wherein the first material portion has the holes,
wherein the holes are lined by the second material portion.

2. The method according to claim 1, further comprising the holes having a diameter of less than 1 mm, less than 0.5 mm or less than 0.1 mm.

3. The method according to claim 1, further comprising the accommodating layer having more than 10 of the holes, more than 100 of the holes or more than 1000 of the holes.

4. The method according to claim 1, further comprising at least one further hole being formed in a radius of less than 50 mm, less than 25 mm or less than 5 mm.

5. The method according to claim 1, further comprising creating defects in an inner structure of the solid to predefine the detachment plane with at least one radiation source.

6. The method according to claim 5, further comprising creating the defects with a laser before or after the application of the accommodating layer on the solid.

7. The method according to claim 6, further comprising setting
up the laser in such a manner that beams emitted for creating the detachment plane penetrate into the solid to a defined depth of more than 100 µm, more than 200 µm, more than 400 µm or more than 700 µm.

8. The method according to claim 6, further comprising creating the defects with the laser being a femtosecond laser.

9. The method according to claim 8, further comprising choosing an energy of the femtosecond laser in such a manner that a damage propagation in the solid is smaller than 3-times the Rayleigh length, smaller than the Rayleigh length or smaller than a third of the Rayleigh length.

10. The method according to claim 8, further comprising choosing a wavelength of the laser such that the absorption of the solid is lower than 10 cm-1, lower than 1 cm-1 or smaller than 0.1 cm-1.

11. The method according to claim 8, further comprising the defects being in each case created as a consequence of multiple-photon excitation effected by the femtosecond laser.

12. The method according to claim 5, further comprising setting up the radiation source in such a manner that beams emitted by the radiation source for creating the detachment plane penetrate into the solid to a defined depth of less than 200 µm, less than 100 µm, less than 50 µm or less than 20 µm.

13. The method according to claim 5, further comprising the radiation source having a pulse duration of less than 10 ps, less than 1 ps or less than 500 fs.

14. A wafer produced by the method of claim 1.

15. The method according to claim 1, wherein the at least one polymer material is polydimethylsiloxane.

16. The method according to claim 1, wherein the second material portion coats the first material portion on an upper side parallel to the connecting layer.

17. The method according to claim 1, wherein the first material portion comprises the at least one polymer material, and wherein the second material portion comprises metal.

* * * * *